(12) United States Patent
Jefferson et al.

(10) Patent No.: US 6,753,593 B1
(45) Date of Patent: Jun. 22, 2004

(54) QUANTUM WIRE FIELD-EFFECT TRANSISTOR AND METHOD OF MAKING THE SAME

(75) Inventors: John H Jefferson, Dera Malvern (GB); Timothy J Phillips, Dera Malvern (GB)

(73) Assignee: QinetiQ Limited, London (GB)

( * ) Notice: Subject to any disclaimer, the term of this patent is extended or adjusted under 35 U.S.C. 154(b) by 0 days.

(21) Appl. No.: 09/701,884

(22) PCT Filed: Jun. 18, 1999

(86) PCT No.: PCT/GB99/01940
§ 371 (c)(1),
(2), (4) Date: Dec. 11, 2000

(87) PCT Pub. No.: WO99/66562
PCT Pub. Date: Dec. 23, 1999

(30) Foreign Application Priority Data

Jun. 19, 1998 (GB) .............................. 9813142

(51) Int. Cl.[7] .............................................. H01L 29/04
(52) U.S. Cl. ........................ 257/627; 257/618; 257/622
(58) Field of Search ................................ 257/618, 622, 257/627, 14, 17, 20, 24, 25, 27, 188, 194, 192, 23, 11, 187

(56) References Cited

U.S. PATENT DOCUMENTS

| | | | |
|---|---|---|---|
| 5,571,376 A | * | 11/1996 | Bestwick et al. |
| 5,612,255 A | * | 3/1997 | Chapple-Sokol et al. |
| 5,679,962 A | * | 10/1997 | Kizuki |
| 5,942,790 A | * | 8/1999 | Park et al. |
| 5,945,686 A | * | 8/1999 | Fukuda |
| 6,063,688 A | * | 5/2000 | Doyle et al. |
| 6,242,275 B1 | * | 6/2001 | Kim et al. |

FOREIGN PATENT DOCUMENTS

| | | |
|---|---|---|
| EP | 0 386 388 | 9/1990 |
| GB | 2 295 272 | 5/1996 |
| WO | 89/07832 | 8/1989 |

OTHER PUBLICATIONS

Wang X–L et al: "Flaw Rate Modulation Epitaxy of ALGAAS/GAAS Quantium Wires on Nonplanar Substrate" Applied Physics Letters, vol. 66, No. 12, (Mar. 1995) pp. 1506–1508.

* cited by examiner

*Primary Examiner*—Nathan J. Flynn
*Assistant Examiner*—Kevin Quinto
(74) *Attorney, Agent, or Firm*—Nixon & Vanderhye P.C.

(57) ABSTRACT

A quantum wire field-effect transistor having at least one, one-dimensional, elongate conducting means (14) provided by at least a first semiconductor layer surrounded by a wider bandgap, second semiconductor layer (12, 13) and extending between source (24) and drain (26) electrodes, and in which there is provided a backgate structure (8, 23) to control conduction in the elongate conducting means. The transistor can be a Single Electron Transistor (SET) wherein two adjacent gate electrode (16, 18) are disposed over the elongate conducting means to induce a quantum dot (17) therein, and it can be made with the first semiconductor layer material as GaAs and the second semiconductor layer material as AlGaAs. A method of making the transistor involves preferentially growing the elongate conducting means at the bottom of a groove (6) lined with second semiconductor layer (12).

32 Claims, 4 Drawing Sheets

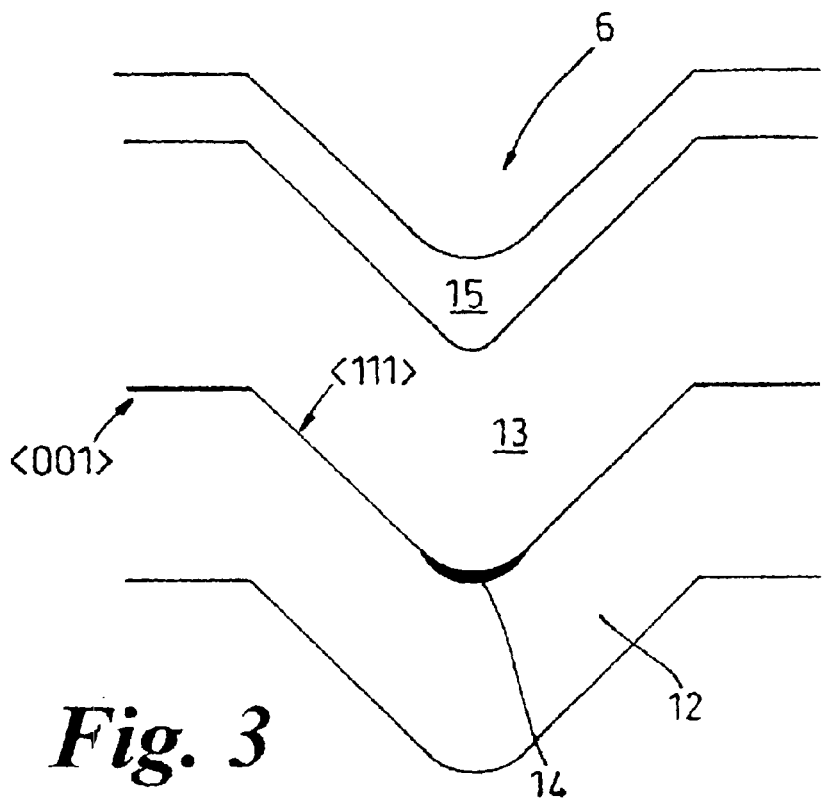
Fig. 3
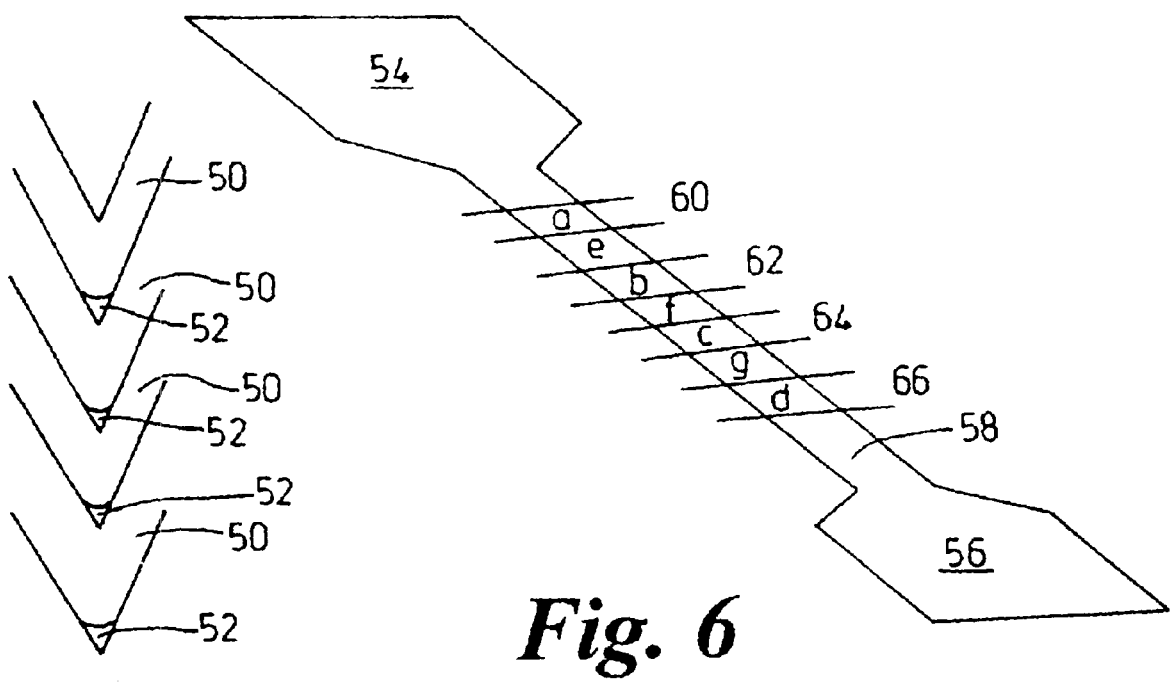
Fig 5
Fig. 6

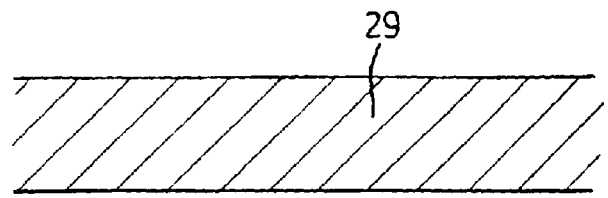
Fig. 4a
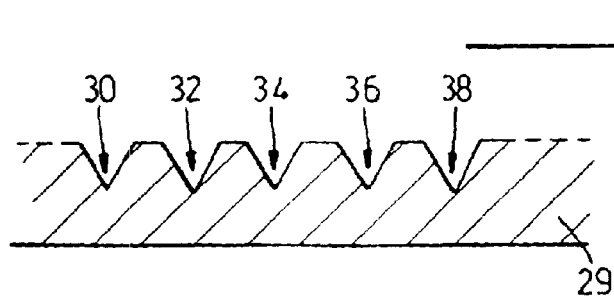
Fig. 4b
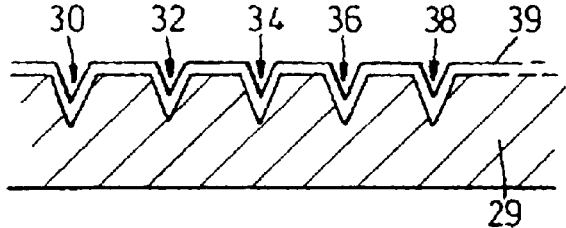
Fig. 4c
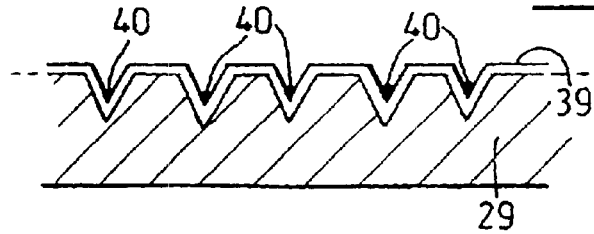
Fig. 4d
Fig 4e

QUANTUM WIRE FIELD-EFFECT TRANSISTOR AND METHOD OF MAKING THE SAME

This application is the U.S. national phase of International Application No. PCT/GB99/01940, filed Jun. 18, 1999, which designated the U.S., the entire content of which is hereby by incorporated reference.

BACKGROUND OF THE INVENTION

1. Field of the Invention

This invention relates to an improved structure for a transistor and methods for providing such a transistor.

2. Discussion of Prior Art

Over the last two decades there has been much interest in semiconductor devices which operate by restricting the motion of current carriers in one or more directions. In such devices the carriers can only occupy a discrete set of energy levels or sub-bands in one or more dimensions. The motion of the carriers is said to be quantised in the direction of confinement.

In heterojunctions, formed by the joining together of two semiconductor compounds of different band gaps, the carriers are confined to a potential or quantum well. A two dimensional electron gas is formed if the carriers are electrons (or a two dimensional hole gas is formed if the majority carriers are holes).

One particular type of semiconductor device which has been fabricated, typically from GaAs, is the single electron transistor (SET) which was invented in 1987. In this device the two dimensional electron gas is further confined by external gates to form a so called quantum dot which is of such a size that it can hold only a few electrons (typically between 0 and 20). Furthermore, once this number is fixed (by an external contact potential) it does not fluctuate in time by more than one electron.

Such devices are traditionally confined to operate at low temperatures (typically less than liquid nitrogen temperatures) due to the physics which allows them to function. The devices rely on the fact that the quantum dot has a small capacitance, and the energy required to add or remove electrons is quite large. If the device is cooled to low temperatures the electron thermal energy becomes less than the charging energy. Without a significant source-drain voltage bias the electrons cannot travel through the quantum dot. That is, the capacitance of the dot is so small that the addition of a single electron to the potential well significantly increases the electrostatic energy. This is known as Coulomb blockade which suppresses current flow for all gate voltages except to certain values at which the energy of N and N+1 electrons in the quantum dot is approximately the same.

SUMMARY OF THE INVENTION

It is an ongoing aim to increase the operating temperature of quantum devices. One method of achieving this is to attempt precise patterning and etching of structures to provide further confinement of the two dimensional electron gas. However, this requires much smaller dimensions and also greater dimensional uniformity than can be realised by traditional lithography and etching. The skilled person will appreciate that using standard optical lithography feature sites of substantially 0.1 $\mu$m and registration of substantially ±0.3 $\mu$m are achievable. Moving to e-beam lithography the feature sizes decrease to 30 nm with a registration of 100 nm.

According to a first aspect of the invention there is provided a transistor having at least one, substantially one-dimensional, elongate conducting means provided by at least a first semiconductor substantially surrounded by a second semiconductor and extending between source and drain electrodes, and in which there is provided at least one further gate electrode in a region of the elongate conducting means.

Such a transistor has the advantage that it is possible to provide confinement for the electrons on a much smaller scale than was previously obtainable. The transistor may be a single electron transistor (SET). The skilled person will appreciate that this is of fundamental importance for producing SETs which operate at higher temperatures; it is possible to reduce the capacitance of the dot by reducing the dimensions of the dot. An electron gas is "hard" confined in two dimensions by the conducting means.

The conducting means may be provided in a bottom region of a groove. This technique allows the conducting means to be fabricated with smaller dimensions than is possible with lithography techniques.

The first semiconductor may be gallium arsenide (GaAs). The second semiconductor may be aluminium gallium arsenide (AlGaAs). As the skilled person will appreciate these materials are particularly suitable since they are relatively well lattice matched and have a suitably large band gap difference. However, other material systems may equally be possible. For instance indium antimonide (InSb) may be suitable, possibly with gallium nitride (GaN), or possibly with aluminium nitride (AlN).

In one embodiment a groove is formed into a substrate, which may be the same material as the first semiconductor and has a region of the second semiconductor, provided at the base of the groove, and on the sides of the grooves lining the groove. The conducting means may comprise an elongate region of the first semiconductor in a bottom region of the second semiconductor, that is in a bottom region of the lined groove. A layer of a third semiconductor may be provided on top of the first semiconductor. This provides a convenient structure for providing the two dimensional hard confinement. The skilled person will appreciate that this structure could be used with the material systems discussed above. The second and third semi conductors may be substantially the same materials, providing a convenient way of surrounding the first semiconductor with the second.

An anti-oxidation layer may be provided associated with (e.g. on top of) the third semi-conductor layer to prevent oxidation of the third semi-conductor layer. The anti-oxidation layer may be the same material as the first semi-conductor. That is the anti-oxidation layer may be GaAs.

The region of the first semiconductor (possibly GaAs) in the bottom of the second semiconductor lined groove may be thought of as a quantum wire. If the wire is sufficiently short, and free from impurities, quantised conduction steps may be seen, which would be indicative of one dimensional conduction. However, fluctuations in the thickness of the wire may be provided and give rise to Coulomb blockade. This Coulomb blockade would give single electron transistor action. In the embodiment where quantised conduction occurs transistor action may also be achievable by the provision of gate structures to provided segregation of the wire into one or more quantum dots. Indeed, multiple gates may be provided to achieve multiple quantum dots. The skilled person will appreciate that prior art transistors generally have 2-dimensional or 3-dimensional conducting means. In the context of this description a 1-dimensional conducting means may be thought of as a wire rather than as a plane, or box.

Preferably the groove is provided within a top region of a mesa structure projecting from a substrate, providing a convenient way of isolating the v-groove from the substrate.

There may be provided more than one conducting means. These may be provided substantially horizontally next to one another and possibly substantially parallel to each other. Alternatively, or additionally, these may be provided substantially vertically above one another. Indeed, a two dimensional grid of conducting means may be provided. Providing more than a single conducting means can have a number of advantages including: it can increase the maximum current handling capability of the device; it can increase the tolerance of the device to defects within the manufacturing process/materials used (The skilled person will appreciate that during crystal growth and device processing defects occur. Having more that a single conducting member can increase the tolerance to these defects); the tolerance of random events, such as photon interactions, can also be increased.

The skilled person will appreciate that the gate electrodes provide soft confinement within the conducting means and effectively provide a quantum dot. There may be provided a plurality of quantum dots along the conducting means. A plurality of dots can be advantageous for a number of reasons. For instance, it has been found that when providing a transistor from a series of dots the performance of the transistor is governed by the dot having the smallest dimensions. The skilled person will realise that the dimensions of a number of quantum dots fabricated in series will be slightly different due to the registration tolerances and that therefore the overall performance of the transistor may be increased (one of the devices may be smaller than expected). Further, it may be possible to form a device which functions similarly to a shift register, with an electron being clocked through each of the quantum dots.

The series of dots may be provided by a plurality of gate electrodes.

A pair of electrodes may be required to provide a single quantum dot. This pair of electrodes may be arranged to provided confinement in a third dimension for charge carriers within the conducting means. That is, the electrodes may be substantially transverse to the conducting means. Each electrode may be capable of causing a peak within the energy bands of the semiconductor of the conducting means such that charge carriers cannot cross the peak without the application of an external bias.

A back gate may be provided in addition to the electrodes so providing a source of charge carriers for the transistor. The back gate may be provided by doping a region of the substrate from which the transistor is fabricated.

Alternatively, or in addition to the provision of a back gate a region of modulation doping may be provided in order to provide charge carriers for the transistor.

A portion of the conducting means may have a crescent shaped cross section, which may be the third semiconductor. The third semiconductor may have a width substantially in the range 10 nm to 60 nm, possibly substantially in the range 20 nm to 50 nm, or possibly in the range 30 nm to 40 nm. The third semiconductor may have a maximum thickness of substantially 1 to 10 nm, possibly substantially 3 to 7 nm.

The materials used to provide the conducting means may have a band gap difference of substantially at least 0.3 eV, possibly at least 0.5 eV or possibly at least 1 eV.

According to a second aspect of the invention there is provided a method of providing a transistor comprising providing a substantially one-dimensional elongate conducting means by providing an elongate region of first semiconductor substantially surrounded by a second semiconductor providing a source electrode at a first end region of the conducting means and a drain electrode at a second end region of the conducting means, and providing at least one further gate electrode in a region of the conducting means.

Such a method is advantageous because it may provide a transistor with better operating characteristics than has previously been achievable (e.g. operating temperature may be higher, etc.). The transistor may be a single electron transistor (SET).

The method may comprise fabricating a groove in a substrate. The groove may be formed by an anisotropic etch, may be using a sulphuric/peroxide etch.

Prior to the etching of the groove in the first semiconductor an $n^+$ epilayer may be grown onto the substrate. The groove may be formed in this epilayer. The epilayer may have a thickness of substantially 5 $\mu$m. The epilayer is advantageous because it provides a back gate which supplies charge carriers to the transistor.

In an alternative and perhaps preferred embodiment a $p^-$ doped region is grown in a top region of the $n^+$ epilayer and the groove formed in the $p^-$ doped region. This is perhaps preferred because it may allow a wire formed in the groove to be more readily insulated from the $n^+$ epilayer and thus help to prevent shorting between the $n^+$ epilayer and the wire.

The groove may be lined with a second semiconductor. The first semiconductor may be provided in a bottom region of the lined groove. A third semi-conductor may be provided, covering the first semi-conductor. These steps may provide the elongate conducting means (or wire) from the first semi-conductor surrounded by second and third semi-conductor. An advantage of using these steps is that the dimensions of the conducting means can be made smaller than by using prior art methods. The substrate and first semiconductors may be substantially the same material. The second and third semi-conductors may be substantially the same material. This structure is advantageous since it provides two neighbouring heterojunctions surrounding the conducting means and provides hard confinement for carriers within the conducting means, i.e. hard confinement in two dimensions.

The skilled person will appreciate that the if the GaAs/AlGaAs material system is used that when depositing GaAs onto AlGaAs the GaAs is preferentially deposited onto (001) planes due to diffusion of the GaAs to the (001) planes. The method may comprise arranging the groove in the substrate such that the second semiconductor is grown substantially only in a bottom region of the groove. This may comprise arranging for the base of the groove to extend substantially in a (001) plane. The skilled person will appreciate that this is possible with any material system that shows preferential deposition of one material on certain planes of the other material. However, the first material may be GaAs and the second material may be AlGaAs. The substrate may be GaAs. The groove may be arranged such that the walls of the groove lies substantially along the (111) planes of the semiconductor.

It is an advantage of this method that the first semiconductor can be provided with dimensions which are smaller than is possible using standard patterning and etching techniques. Therefore, it is possible using this method to provide hard confinement in two dimensions. This has previously not been possible without the use of gate electrodes to provide (or increase) the confinement in the second dimension.

A further layer, an anti-oxidation layer, may be provided over the third semi-conductor layer and prevents oxidation of the third semi-conductor layer. The anti-oxidation layer may be the same material as first semiconductor.

The method may rely on process variations within the fabrication steps of the conducting means to provide quantum dots. As the skilled person will appreciate there are process variations within any device fabrication process. These variations may cause slight variations in the thickness of the conducting means, leading to the formation of quantum dots.

In one embodiment the groove in the substrate is formed slightly off axis from the desired plane. This causes saw—tooth like variation in the thickness of the conducting means, which may provide quantum dots along the length of the conducting means. The skilled person will appreciate that the degree that the groove is formed off axis will determine the period of the saw tooth.

We may choose to incline the base of the groove to the (001) Plane by a few degrees, for example substantially in the range 0–10°, or 0–6°, or 0–3°, or 0 to 1° or 2°.

According to a third aspect of the invention there is provided a groove within a substrate having a first semiconductor provided in a bottom region of the groove and at least one electrode being provided in association with the groove.

This structure may provide useful in a number of electronic devices.

According to a fourth aspect of the invention there may be provided a method of fabricating an elongate conducting means comprising a first semiconductor substantially surrounded by a second semiconductor the method comprising fabricating a groove in a substrate and depositing a first semiconductor into a bottom region of the groove, the method further comprising providing electrodes in association with the conducting means adapted to control the flow of charge carriers through the conducting means.

BRIEF DESCRIPTION OF THE DRAWINGS

There now follows by way of example only a detailed description of the invention with reference to the accompanying drawings of which:

FIG. 3 is an enlargement of the region marked B in FIG. 2;

FIG. 5 shows schematically a cross section through a plurality of conducting means provided vertically above one another; and FIG. 6 shows a plurality of quantum dots fabricated along a quantum wire.

DETAILED DISCUSSION OF EMBODIMENTS

Figure 1:
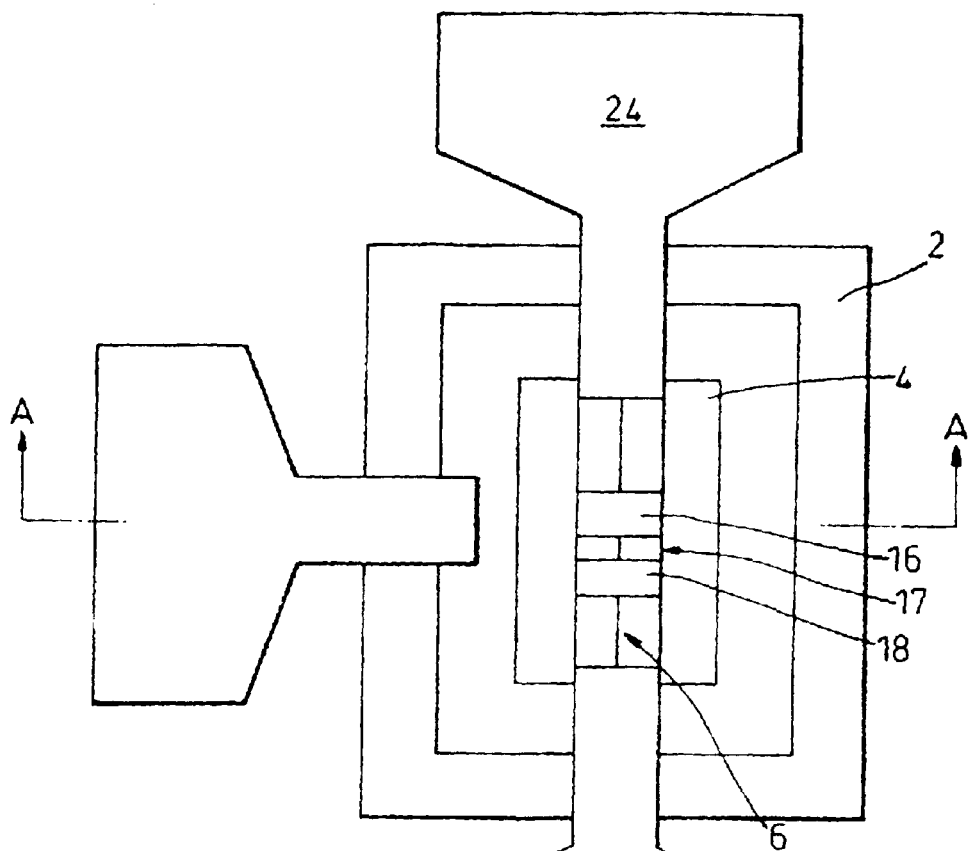
FIG. 1 is a schematic plan view of a transistor according to the present invention.

The transistor shown in the Figures comprises a substrate 2, of GaAs, onto which a double mesa structure 4 comprising a large and a small mesa has been formed. Substantially centrally in a top region of the mesa 4 there is provided a groove 6. The substrate 2 and mesa 4 are provided from GaAs and a region 8 of the mesa 4 has been heavily doped (n$^+$) to provide a conducting back gate and ensure good electrical contact with an electrode 23. The top portion 10 of the mesa 4 is p$^-$ doped.

The groove 6 is lined with a layer of AlGaAs 12 (second semi-conductor) and the bottom region of the AlGaAs 12 has a crescent shaped region of GaAs 14 (first semi-conductor) provided therein. The crescent of GaAs 14 forms a conducting means capable of transporting charge carriers, the conduction band energy being lower in the GaAs. Further a layer of AlGaAs (third semi-conductor) 13 is provided on top of the crescent region of GaAs 14. This structure provides a wire of GaAs 14 surrounded by AlGaAs (effectively providing two heterojunctions) providing hard confinement in two dimensions for carriers in the wire.

A first and a second gate 16 and 18 respectively are provided in a region on top of the third semiconductor 13 and allow the charge carriers flowing within the elongate conducting means to be controlled, providing soft confinement, in a third dimension for carriers within the wire. A region 17 formed between the two electrodes 16, 18 forms a quantum dot wherein charge carriers can be held by peaks in the energy bands of the semiconductor.

Figure 2:
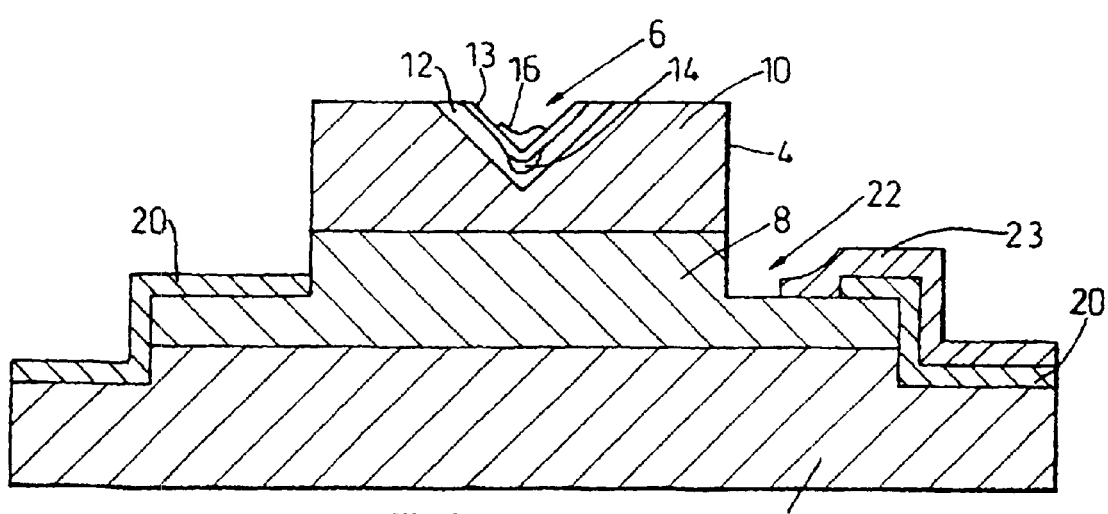
FIG. 2 is a section through the device of FIG. 1 along line AA.

As can be seen in FIG. 2 an isolation oxide 20 is provided to insulate the substrate. A gap 22 is provided in the isolation oxide 20 on the large mesa to allow the gate electrode 23 to be connected to the n$^+$ epilayer/back gate. This gate electrode works in conjunction with the gate electrodes 16, 18 to control the flow of electrons/carriers within the conducting means.

A source electrode 24 is provided by an ohmic contact at a first end of the conducting means and a drain electrode 26 is provided, also by an ohmic contact, at the other end of the conducting means.

A proposed fabrication scheme will now be described in relation to FIG. 4. FIG. 4a shows an unprocessed substrate 28 GaAs onto which there is grown an n$^+$ epilayer 29 approximately 5 μm in depth. As shown in FIG. 4b V grooves 30–38 are etched (after photo-resist and lithography) using a sulphuric/peroxide anisotropic etch. It should be noted that the method disclosed with reference to FIG. 4 does not include providing the p$^-$ region as shown in FIG. 2.

Once the grooves 30–38 have been formed a nominally undoped layer 39 of AlGaAs, a second semiconductor, approximately 0.2 μm in depth is grown on to the surface of the substrate 28 so that the grooves 30–38 are also lined (FIG. 4d). The grooves 30–38 are arranged such that the layer of AlGaAs substantially has (111) planes aligned with the edge walls of the grooves.

A few mono-layers of GaAs 40, a first semiconductor, are then grown onto the layer of AlGaAs 39 (FIG. 4e). It is desirable that this layer should be as thin as possible but practical considerations presently mean that it has a depth of between substantially 1 nm and 30 nm. The physics of this growth process are such that the GaAs preferentially grows on (100) planes of the AlGaAs 39 (due to diffusion of the GaAs) and has a slow growth rate on the (111) planes. Therefore, since the AlGaAs has been arranged to have the (111) planes aligned with the side walls of the grooves 30–38 the GaAs is grown substantially in only the bottom regions of the grooves 30–38 and also on the top surfaces. This structure provides the wire like conducting means.

The conducting means may be thought of as a quantum wire and the wire may have a length substantially in the range of 0.7 μm to 2 μm possibly substantially in the range 0.7 μm to 15 μm. In order to decrease the influence of defects it is generally better to reduce the length of the wire.

Figure 4F:
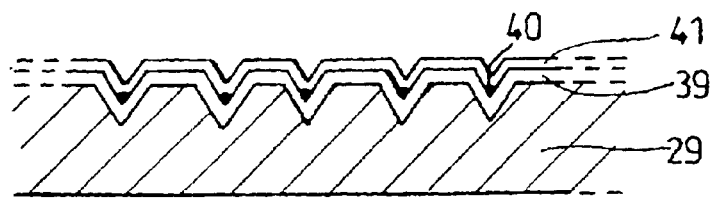
FIG. 4 schematically shows some of the steps for fabricating the device of FIGS. 1 to 3.

A layer of third semiconductor 41, in this case AlGaAs is grown on top of the conducting means. Thus, the conducting means (first semiconductor) is surrounded by AlGaAs which provides hard confinement in two dimensions. This is shown in FIG. 4f.

A thin layer of undoped GaAs 15 (an anti-oxidation layer which prevents oxidation of the AlGaAs) is grown on top of the third semi-conductor 13. For clarity this layer is not shown in FIG. 4 but can be seen in FIG. 3.

It is then necessary to isolate the grooves 30–38 from one another and a series of mesa structures are used to achieve this. As will be appreciated from the cross section of FIG. 2 and FIG. 4h each mesa has two cross sections: a small and a large.

Figure 4G:
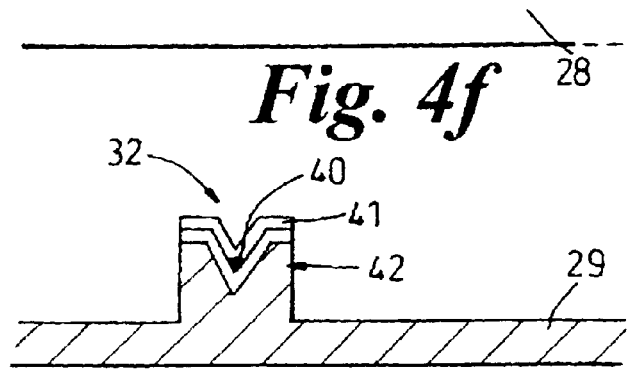
Figure 4H:
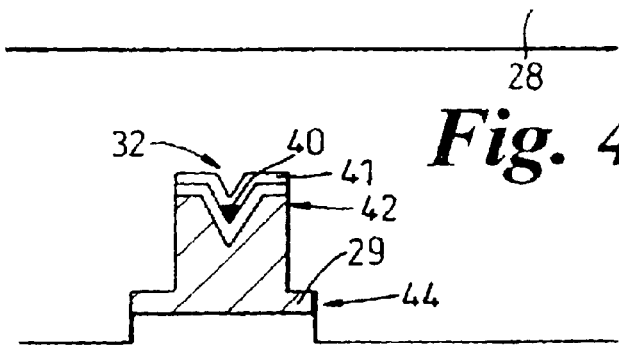

Firstly, the small diameter 42 mesa is provided (FIG. 4g). The width of each of these is approximately 15 μm (but may be substantially in the range 10–15 μm) and depth of each is down part of the way through the $n^+$ layer 29. Next, the large mesa 44 is formed and this has a depth so that it extends down in to the substrate 28, beyond the $n^+$ layer 29 (FIG. 4h). The depth of the $n^+$ layer is not critical, but the skilled person will appreciate that the greater the depth of the $n^+$ layer the greater the material that must be removed to the etch the large masa through the $n^+$ layer.

Figure 4I:
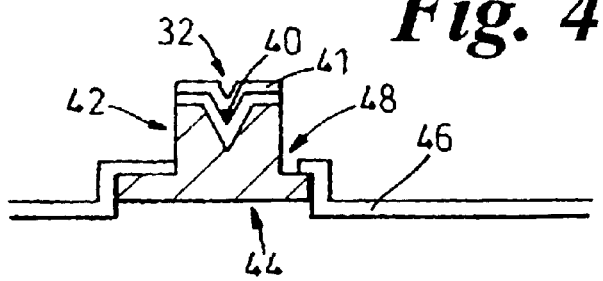

After the mesas 42, 44 have been provided an isolation oxide 46 is deposited over the exposed substrate and over a substantial amount of the large mesa (FIG. 4i). However, gaps 48 are left in the insulating oxide over the large mesas so that contacts can be made to the $n^+$ area (as seen in FIG. 2).

Finally, the necessary metallisation is provided to form the contacts.

The dimensions of the grooves 30–38 are much smaller than those of the contacts and therefore the spaces between the grooves must generally be much greater than the width of the actual grooves. This is shown in FIG. 4e where it can be seen that only some of the grooves 30–38 are kept. Perhaps only as few as 1 in 10 grooves 30–38 may be kept.

The skilled person will appreciate that using with the techniques outlined above it would be possible to provide a plurality of conducting means (or quantum wires) within a single groove and such a structure can be seen schematically in FIG. 5. A plurality of V grooves of AlGaAs 50 are shown with regions of GaAs 52 formed in bottom regions thereof. This may be one technique of providing a plurality of conducting means in parallel. A number of conducting means may be provided horizontally beside one another (as opposed to vertically as shown in FIG. 5). Indeed, it may be possible to provide a two dimensional array of conducting means.

As shown in FIG. 6 it may also be possible to provide a plurality of quantum dots along a single quantum wire (or conducting means). A source 54 and drain electrode 56 are provided at opposite ends of a quantum wire 58. A series pairs of electrodes 60–66 are provided transverse to the wire. A quantum dot (a–d) is effectively formed between each pair of electrodes. Indeed, quantum dots may be formed between each pair of electrodes (e–g). A charge carrier may be gated through each of the dots in series. Effectively a charge carrier may be clocked through the wire 58.

It may be possible to grow quite dissimilar lattice constant semiconductor material in a groove to form a quantum wire. The wire need only be very thin, and it is possible to get thin layers of dissimilar lattice constant material to grow epitaxially. It may therefore be chosen to have the material of the wire and the material of the groove to have dissimilar band gap energy levels. For example we could adhere a difference in band gap energy levels of substantially 0.3 eV, or more, or 0.5 eV, or more, or 1.0 eV or more. In general, it is desirable to make this difference as large as possible since this increases the confinement of the electrons in the quantum wire and results in a higher operating temperature.

As the skilled person will appreciate, growing a layer of a material onto another material where there is a large lattice mismatch will generally result in a large number of defects within the grown layer. However, because the grown layers in this transistor are relatively thin it may be possible to tolerate large degrees of lattice mis-match.

What is claimed is:

1. A transistor comprising at least one, substantially one-dimensional, elongate conducting means provided by at least a first semiconductor substantially surrounded by a second semiconductor and extending between source and drain electrodes, and in which there is provided at least one further electrode in a region of the at least one elongate conducting means, the at least one elongate conducting means being provided in a groove within the second semiconductor, said groove being oriented such that at least one wall of the groove is a, substantially planar, surface, substantially parallel to crystal plane on which the growth rate of the first semiconductor is substantially zero.

2. A transistor according to claim 1 wherein the groove is provided by an intersection of two walls, each wall being a substantially planar, surface, roughly parallel to a crystal plane on which the growth rate of the first semiconductor is substantially zero.

3. A transistor according to claim 2 wherein the first semiconductor is provided in a region of the intersection.

4. A transistor according to claim 1 comprising a groove formed into a substrate having a region of the second semiconductor provided on the sides of the grooves lining the groove.

5. A transistor according to claim 4 wherein the first semiconductor and the substrate are substantially the same material.

6. A transistor according to claim 1 wherein the conducting means comprises an elongate region of the first semiconductor in a bottom region of the second semiconductor, that is in a bottom region of the lined groove.

7. A transistor according to claim 1 wherein the groove is provided within a top region of a mesa structure.

8. A transistor according to claim 1 wherein said at least one elongate conducting means comprises two elongate conducting means.

9. A transistor according to claim 1 wherein a quantum dot is provided along a region of the conducting means.

10. A transistor according to claim 9 wherein the at least one further electrode is adapted, in use, to provide the confinement to provide the quantum dot.

11. A transistor according to claim 9 wherein there are provided a plurality of quantum dots along the conducting means.

12. A transistor according to claim 1 wherein said at least one further electrode is arranged to provide confinement in a third dimension for charge carriers within the conducting means, in which hard confinement in two dimensions holds charge carriers within the conducting means.

13. A transistor according to claim 1 wherein said at least one further electrode is arranged substantially transverse to the conducting means.

14. A transistor according to claim 1 wherein said at least one further electrode is arranged to cause a peak within the energy bands of the first semiconductor of the conducting means.

15. A transistor according to claim 1 wherein a portion of the conducting means has a crescent shaped cross section.

16. A transistor according to claim 1 wherein the first semiconductor is gallium arsenide (GaAs).

17. A transistor according to claim 1 wherein the second semiconductor is aluminim gallium arsenide (AlGaAs).

18. A transistor according claim 1 which is a single eletron transistor.

19. A method of providing the transistor according to claim 1 comprising:

providing a substantially one-dimensional elongate conducting means by providing a first semiconductor substantially surrounded by a second semiconductor material, the elongate conducting means being provided by creating a groove of second semiconductor such that at least one wall of the groove is a substantially planer surface roughly parallel to a crystal plane on which the growth rate of the first semiconductor is substantially zero and subsequently providing the first semiconductor in the groove, providing a source electrode at a first end region of the conducting means and a drain electrode at a second end region of the conducting means, and providing at least one further gate electrode in a region of the conducting means.

20. A method according to claim 19 comprising providing the groove by performing an anisotropic etch.

21. A method according to claim 19 wherein the groove is provided in an n$^+$ epilayer grown onto a substrate.

22. A method according to claim 21 wherein the substrate and first semiconductor are substantially the same material.

23. A method according to claim 21 wherein the groove is provided in a p$^-$ doped region provided in a top region of the n$^+$ epilayer.

24. A method according to claim 19 wherein the groove of second semiconductor is provided by lining a groove with second semiconductor.

25. A method according to claim 24 wherein the first semiconductor is grown in a bottom region of the lined groove.

26. A method according to claim 19 wherein the first semiconductor is surrounded by the second semiconductor by provision of a layer of second semiconductor once the first semiconductor has been provided.

27. A method according to claim 19 wherein the first material is GaAs.

28. A method according to claim 19 wherein the second semiconductor is AlGaAs.

29. A method according to claim 19 wherein the groove is arranged such that the walls of the groove lies substantially along the (111) planes of the semiconductor.

30. A method according to claim 19 wherein the groove in the substrate is formed slightly off axis from the planes of the semiconductor.

31. A method according to clam 30 wherein quantum dots arm provided along the conducting means in the vicinity of stops caused due to thickness variations of the conducting means due to the off axis groove.

32. A method according to claim 19 wherein the transistor is a single electron transistor (SET).

* * * * *